United States Patent [19]

Imura et al.

[11] Patent Number: 4,460,412

[45] Date of Patent: Jul. 17, 1984

[54] METHOD OF MAKING MAGNETIC BUBBLE MEMORY DEVICE BY IMPLANTING HYDROGEN IONS AND ANNEALING

[75] Inventors: Ryo Imura, Sayama; Tadashi Ikeda; Ryo Suzuki, both of Kodaira; Nagatugu Koiso, Tama; Teruaki Takeuchi, Kokubunji; Hiroshi Umezaki, Mitaka; Yutaka Sugita, Tokorozawa, all of Japan

[73] Assignee: Hitachi, Ltd., Tokyo, Japan

[21] Appl. No.: 367,675

[22] Filed: Apr. 12, 1982

[30] Foreign Application Priority Data

Apr. 15, 1981 [JP] Japan .................................. 56-55551

[51] Int. Cl.[3] .................. H01L 21/265; G11C 19/08; C04B 35/00

[52] U.S. Cl. .................................... 148/1.5; 148/187; 357/91; 365/33; 365/36

[58] Field of Search ..................... 365/36, 33; 148/1.5, 148/187; 357/91

[56] References Cited

U.S. PATENT DOCUMENTS 3,967,002 6/1976 Almasi et al. ......................... 365/33
4,164,029 8/1979 Keefe .................................... 365/36
4,308,592 12/1981 McGouey ............................ 365/36
4,346,456 8/1982 Kinoshita et al. .................... 365/36

OTHER PUBLICATIONS

Brodsky et al., IBM–TDB, 22 (1980) 3404.
Tanoue et al. in Ion Implantation in Semi-Conductors, Ed. Namba, Plenum, N.Y. 1974, P. 285.
Gill, J. App. Phys. 52 (1981) 369.
MacNeal et al. Jour. Appl. Phys. 52 (1980) 2380.
Ahn et al. IBM–TDB, 21 (1978) 1706.

*Primary Examiner*—Upendra Roy
*Attorney, Agent, or Firm*—Antonelli, Terry & Wands

[57] ABSTRACT

A method of implanting a magnetic garnet film with ions is disclosed in which a covering film is provided on a monocrystalline magnetic garnet film for magnetic bubbles, and hydrogen ions are implanted in a desired portion of a surface region in the magnetic garnet film through the covering film. According to this method, it is possible to form an ion-implanted layer in which the ion concentration distribution in the direction of depth is uniform, and moreover the inplane anisotropy field in the ion-implanted layer decreases only a little with time in an annealing process.

18 Claims, 9 Drawing Figures

METHOD OF MAKING MAGNETIC BUBBLE MEMORY DEVICE BY IMPLANTING HYDROGEN IONS AND ANNEALING

BACKGROUND OF THE INVENTION

1. Field of the Invention

The present invention relates to a method of ion implantation, and more particularly to a method of ion implantation for forming an ion-implanted layer (i.e., a strain layer) in a magnetic bubble memory device of the contiguous disk type (hereinafter referred to as a "CD device").

2. Description of the Prior Art

A main feature of a CD device is that the device, as disclosed in U.S. Pat. No. 3,828,329 and others, has a contiguous disk bubble propagation circuit formed by implanting ions in a magnetic garnet film for magnetic bubbles, that is, the device is provided with a bubble propagation circuit having no gap. Therefore, the CD device is considered to be well suited to improve the bit density of magnetic bubble memory devices.

As shown in FIG. 1, the above-mentioned contiguous disk bubble propagation circuit is formed in such a manner that a mask 2 such as a photoresist film or metal film is deposited on a monocrystalline magnetic garnet film 1 for magnetic bubbles, the film 1 is implanted with ions 3 such as hydrogen ions or $Ne^{30}$ ions to generate strain in an ion-implanted layer 4, and the strain thus generated produces an implane anisotropy field in the layer 4 by the reverse effect of magnetostriction. Namely, the direction M of magnetization of the magnetic garnet film 1 having been perpendicular to the surface of the film is made parallel with the film surface due to the ion implantation, as shown in FIGS. 1 and 2.

A bubble propagation circuit 5 is a region which has the form of contiguous disks and is not implanted with the ion, and a charged wall having magnetic charges is formed on the periphery of the bubble propagation circuit 5 to attract a magnetic bubble 6 as shown in FIG. 2.

When a rotating field 7 is applied, the charged wall is moved along the outer periphery of the bubble propagation circuit 5, and the magnetic bubble 6 is thereby transferred.

As mentioned above, a CD device is provided with a bubble propagation circuit having no gap. Accordingly, it is expected that a CD device which is at least four times higher in bit density than a conventional type magnetic bubble memory device, that is, has a bit capacity of more than 4 Mb, is formed through the photolithography technique. Further, it is expected that a magnetic field for driving magnetic bubbles can be greatly reduced by using a contiguous disk bubble propagation circuit.

In a CD device an ion-implanted layer (namely, a strain layer) formed in a magnetic garnet film plays a very important role, and the following two conditions must be satisfied in order to obtain a favorable bias field margin in the CD device.

(1) An anisotropy field $H_K$ in the magnetic garnet film for magnetic bubbles is positive, while an anisotropy field $H_K$ in the ion-implanted layer is negative.

(2) A strain distribution in the direction of depth is uniform over a wide range in the ion-implanted layer, as shown in FIG. 3.

In order to satisfy the condition (1), it is required that hydrogen ions are implanted in the magnetic garnet film to form the ion-implanted layer. Further, in order to satisfy the condition (2), it is required that the implanted magnetic garnet film is annealed, or a multiple ion implantation using a plurality of kinds of ions such as $H_2^+$ ions and $He^+$ ions is carried out to form the ion-implanted layer.

However, in the case where hydrogen ions ($H^+$ ions, $H_2^+$ ions or $D_2^+$ ions) are implanted in the magnetic garnet film to obtain a large inplane anisotropy field, it has been found that the anisotropy field ($H_K-4\pi M_s$) decreases greatly with time at various annealing temperatures as shown in FIG. 4. Incidently, FIG. 4 shows the dependence of anisotropy field on annealing time at various annealing temperature $T_a$ in the case where $H^+$ ions having an implant energy of 100 KeV are implanted in the magnetic garnet film at an ion dose of $2\times10^{16}$ cm$^{-2}$.

Taking into consideration the fact that the strain distribution pattern is shifted by annealing toward the surface of the magnetic garnet film as shown in FIG. 5, such decrease in anisotropy field is considered to be based upon the phenomenon that $H^+$ ions escape from the magnetic garnet film through the surface thereof. In FIG. 5, a curve a indicates a strain distribution in the direction of depth in the magnetic garnet film in the case where $H^+$ ions having an implant energy of 60 KeV are implanted in the magnetic garnet film at an ion dose of $2\times10^{16}$ cm$^{-2}$, and a curve b a strain distribution in the case where $H^+$ ions are implanted in the same manner as above and then the magnetic garnet film is annealed at 320° C. for 3 hours. The degree of strain generated in a garnet film corresponds to an etch rate at which the garnet film is etched by an etchant. Accordingly, in FIGS. 3 and 5, strain is expressed in terms of an etch rate.

As shown in FIG. 5, strain generated in the garnet film by ion implantation is shifted toward the surface of the film, that is, the strain distribution pattern is transferred to a shallow region when the film is annealed, and moreover the uniformity of the strain distribution is increased by annealing. However, the uniformity of the strain distribution by only annealing is insufficient, and a higher uniformity is required. Such a change in strain distribution is caused by the movement of $H^+$ ions from a deep position in the garnet film to a shallow position in the annealing process. Further, it is considered that a fair amount of $H^+$ ions evaporate from the garnet film in the annealing process.

When a CD device is formed, ion implantation is carried out to form an ion-implanted layer, and then some annealing is performed. For example, the implanted garnet film is heated to a temperature of 350° C., when a permalloy layer is deposited on an insulating film through an evaporation technique to form a detector.

Accordingly, the strain distribution in the ion-implanted layer is made uniform by the heat treatment performed after ion implantation, and thus the above-mentioned condition (2) is satisfied. However, in order to put such a CD device to practical use, it is desirable to make the uniformity of the strain distribution in the ion-implanted layer higher. Further, a fair amount of $H^+$ ions escape from the ion-implanted layer at the time of heat treatment, and therefore the above-mentioned condition (1) cannot be satisfied. As a result, the implane anisotropy field ($H_K-4\pi M_s$) is weakened, and it is difficult to reduce the strength of rotating field in a large degree.

SUMMARY OF THE INVENTION

An object of the present invention is to provide a method of forming a CD device which can solve the above-mentioned problems of the prior art and is sufficiently large in bias field margin in driving magnetic bubbles.

Another object of the present invention is to provide a method of ion implantation capable of forming an ion-implanted layer in which the anisotropy field $H_K$ is negative and the strain distribution is uniform.

In order to attain the above objects, according to the present invention, a covering film, for example, an $SiO_2$ film is provided on a monocrystalline magnetic garnet film, and then hydrogen ion implantation and annealing are carried out to form an ion-implanted layer at a desired portion of a surface region in the magnetic garnet film.

DESCRIPTION OF THE DRAWINGS

The above and other objects, features and advantages of the present invention will become apparent from the following detailed description taken in conjunction with the accompanying drawings, in which.

Now, the present invention will be explained below in detail, with reference to the drawings.

Figure 1:
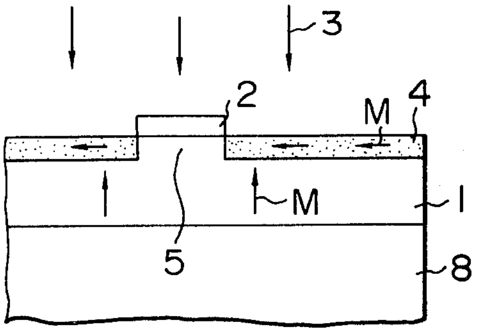
FIGS. 1 and 2 are schematic views for explaining the fabricating method of a conventional CD device and the operation thereof.
Figure 2:
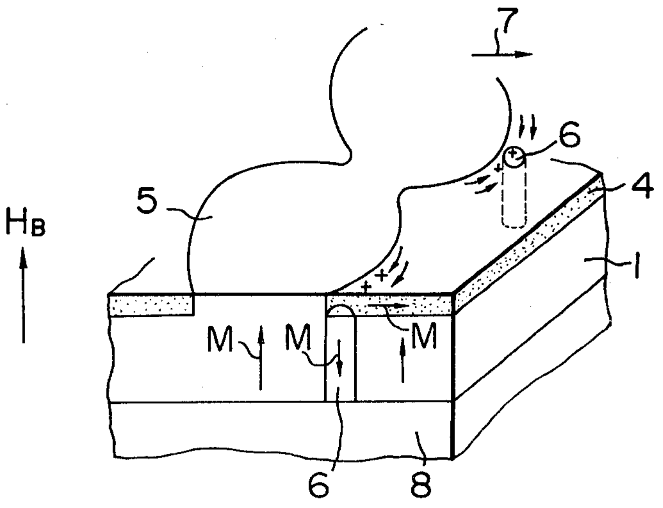
Figure 3:
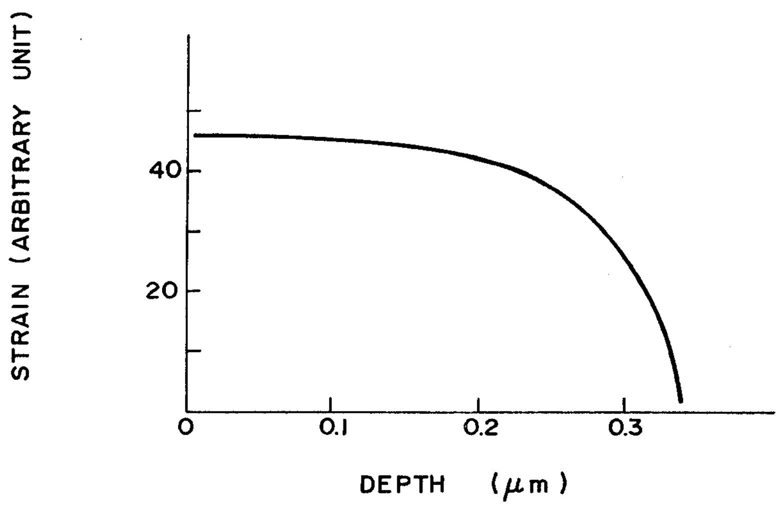
FIG. 3 is a graph showing a strain distribution in the direction of depth in an ion-implanted layer.
Figure 4:
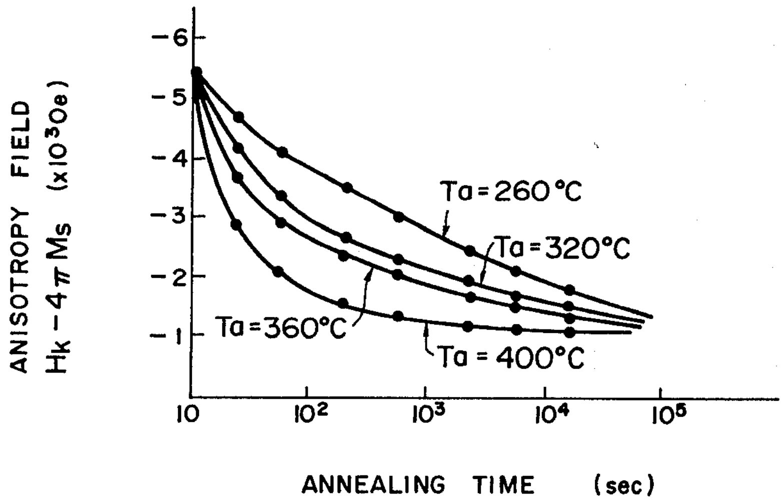
FIG. 4 is a graph showing relations between anisotropy field and annealing time.
Figure 5:
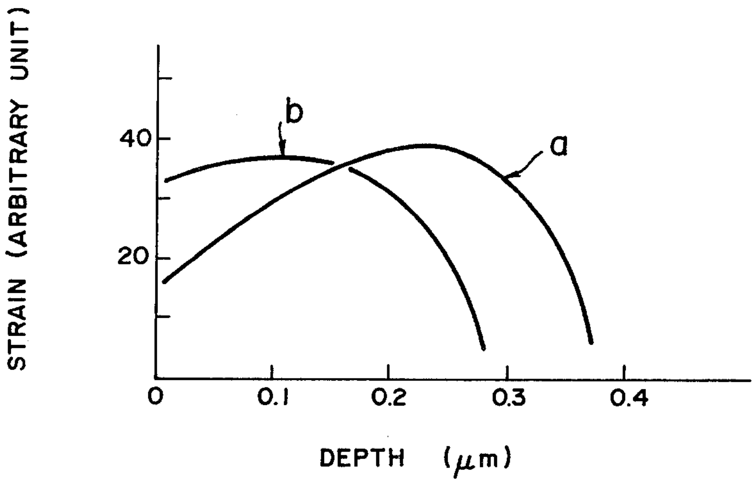
FIG. 5 is a graph showing a relation between strain distribution and annealing.
Figure 6:
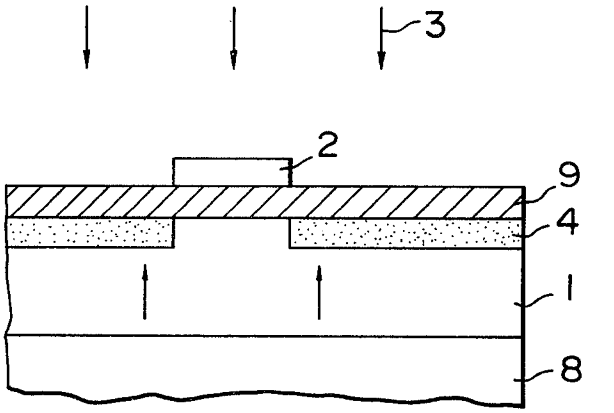
FIGS. 6 to 8 are schematic views for explaining the gist of the present invention.

FIG. 6 is a schematic view for showing the gist of the present invention.

DESCRIPTION OF THE PREFERRED EMBODIMENTS

Referring to FIG. 6, a $(YSmLuCa)_3(FeGe)_5O_{12}$ film which is a magnetic garnet film 1 for magnetic bubbles, is formed, by the liquid phase epitaxial growth method, on a (111) oriented plane of a monocrystalline nonmagnetic substrate 8 made of gadolinium gallium garnet. A covering film 9, for example, an insulating film such as an $SiO_2$ film is formed on the magnetic garnet film 1. Thereafter, hydrogen ion implantation is carried out while using a mask 2 and then annealing is performed, to form an ion-implanted layer 4 in a surface region of the garnet film 1.

Figure 7:
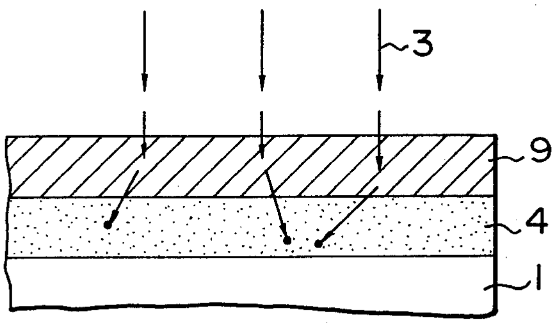

When hydrogen ions 3 ($H^+$ ions, $H_2^+$ ions, or $D_2^+$ ions) pass through the covering film 9, the ions 3 are scattered by the covering film 9, that is, the moving direction of the ions 3 is irregularly changed by the covering film 9 as shown in FIG. 7, and the scattered ions enter the magnetic garnet film 1 to form the ion-implanted layer 4.

As is well known, in the case where the ions are implanted into the garnet film without passing through the insulating film (namely, the covering film), the impurity concentration distribution in the direction of depth in the garnet film takes a Gaussian distribution.

However, according to the present invention, the ions enter the garnet film after having been scattered by the insulating film, and therefore the impurity concentration distribution in the direction of depth in the garnet film does not take any Gaussian distribution. Accordingly, when annealing is performed for uniformalization of the impurity concentration distribution at a later stage, a very uniform distribution of impurity concentration is obtained. As a result, the strain distribution in the ion-implanted layer becomes uniform, and the condition (2) requires for the ion-implanted layer is far more satisfied than in the conventional method.

Further, in the field of the fabrication of semiconductor devices, ion implantation is carried out in such a manner that, after having been coated with an insulating film, a surface of a semiconductor substrate is implanted with ions such as arsenic or boron ions in order to prevent contamination on the surface of the substrate.

In this case, however, the implant ions are large in both atomic weight and atomic radius, and therefore the moving direction of the ions is changed only a little by the insulating film. Accordingly, the impurity (implanted ion) concentration distribution in the direction of depth in the substrate is scarcely affected by the presence of the insulating film coated on the substrate, that is, it cannot be expected that the impurity concentration distribution in the direction of depth is made uniform by the insulating film.

On the other hand, hydrogen ions directed to and implanted in a garnet film in the present invention are very small in both atomic weight and atomic radius, and therefore the moving direction of the hydrogen ions is changed greatly by a covering film. Accordingly, the impurity concentration distribution in the direction of depth in the garnet film is changed in a great degree and made uniform by the covering film.

Further, according to the conventional method, when a garnet film is annealed after having been implanted with hydrogen ions, a number of hydrogen ions evaporated from the garnet film, and thus there arises a problem that the inplane anisotropy field is greatly reduced.

Figure 8:
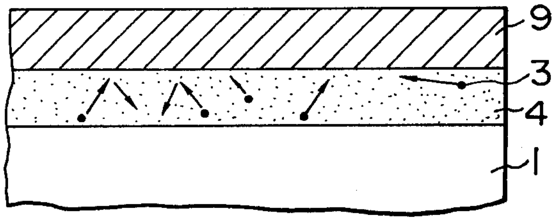

According to the present invention, a covering film 9 is provided on the garnet film as shown in FIG. 6. When the garnet film is annealed, the covering film 9 prevents the hydrogen ions 3 in the ion-implanted layer 4 from escaping from the layer 4, as shown in FIG. 8.

Figure 9:
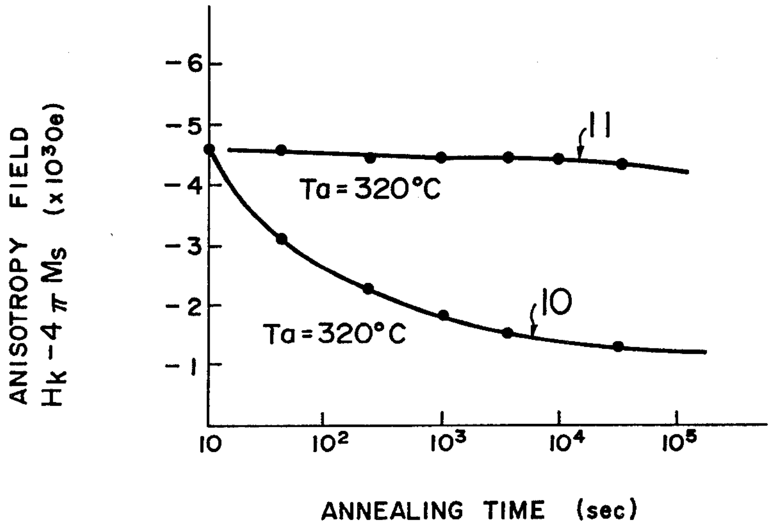
FIG. 9 is a graph for showing an effect of the present invention.

In the case where a garnet film which is not provided with the covering film and has been implanted with hydrogen ions is annealed at a temperature of 320° C., the inplane anisotropy field is reduced rapidly, as indicated by a curve 10 in FIG. 9. In the case where a garnet film which has the covering film in accordance with the present invention, is annealed at the same temperature, the inplane anisotropy field is reduced only a little as indicated by a curve 11 in FIG. 9, and therefore the previously-mentioned condition (1) is satisfied. In more detail, FIG. 9 shows the results obtained in the case where ion implantation was carried out four times in such a manner that hydrogen ions having implant energy of 100 KeV, hydrogen ions having energy of 85 KeV, hydrogen ions having energy of 70 KeV and hydrogen ions having energy of 55 KeV were implanted in a $(YSmLuCa)_3(FeGe)_5O_{12}$ film at ion doses of $2.5\times10^{16}$, $2.3\times10^{16}$, $2.3\times10^{16}$ and $2.1\times10^{16}$ $cm^{-2}$, respectively and then the film was annealed. Further, the curve 11 in FIG. 9 shows the results in the case where an $SiO_2$ film having a thickness of 1000 Å was used as the covering film.

As mentioned above, a covering film according to the present invention has two effects, that is, an effect that the covering film acts as a scatterer for hydrogen ions when ion implantation is carried out, thereby making uniform the ion concentration distribution in the direction of depth in a garnet film, and another effect that the covering film prevents the hydrogen ions from evaporating from the garnet film in an annealing process, thereby preventing the inplane anisotropy field from decreasing.

A covering film capable of producing such characteristic effects is not limited to an $SiO_2$ film, but can be formed of one selected from a group including various insulating films such as $TiO_2$, SiO, $Al_2O_3$, $Cr_2O_3$, and $SiN_4$ films and a phosphosilicate glass film, various conductor films such as Au, Mo and Cr films and an Au-Cu alloy film, and semiconductor films such as an amorphous silicon film and a polycrystalline silicon film. Further, the covering film may be formed of two or more kinds of films selected from the above-mentioned group.

It is preferable that the above-mentioned insulating films have a thickness of about 500 to 6000 Å when used as the covering film.

When the thickness of an insulating film is less than 500 Å, the insulating film cannot sufficiently exhibit the effect that incident hydrogen ions are scattered by the insulating film and thus the ion concentration distribution in the direction of depth in a garnet film is made uniform. When the thickness of the insulating film is greater than 6000 Å, an implant energy of more than 400 KeV is required to implant hydrogen ions in the garnet film. It is difficult to carry out such ion implantation. For the same reasons, it is preferable that the above-mentioned conductor and semiconductor films have a thickness of about 500 to 3000 Å when used as the covering film.

On the other hand, in order to effectively prevent hydrogen ions from evaporating from a garnet film at the annealing time, it is preferable that the insulating films, conductor films and semiconductor films have a thickness of more than about 500 Å when used as the covering film. As is evident from these facts, it is preferable that an insulating film used as a covering film according to the present invention has a thickness of about 500 to 6000 Å and a conductor or semiconductor film used as the covering film has a thickness of about 500 to 3000 Å.

When an insulating film having a thickness of about 500 to 3000 Å is used as the covering film, it is not required to remove the insulating film after annealing, but the insulating film can serve as an insulating film (spacer) of CD device as it is. Accordingly, such an insulating film is advantageously used from the practical point of view. The above-mentioned ion implantation is preferably carried out with acceleration energy of 25–400 KeV. With energy lower than 25 KeV ion implantation will not be substantially effected and no strain layer will be formed while energy higher than 400 KeV will require a large scale implantation apparatus which is impractical.

In the above-mentioned explanation, a film made of $(YSmLuCa)_3(FeGe)_5O_{12}$ is used as a magnetic garnet film for magnetic bubbles. This material is one of materials which are used to make the magnetic garnet film, and the magnetic garnet film may be made of other materials.

As mentioned above, according to the present invention, after a covering film has been provided on a magnetic garnet film, the garnet film is implanted with hydrogen ions and then annealed. Thus, the strain distribution in the magnetic garnet film is made uniform, and hydrogen ions implanted in the magnetic garnet film are prevented from evaporating into an external space.

Needless to say, the above-mentioned effects of the present invention is independent of the kind of the magnetic garnet film. Accordingly, favorable results can be obtained when the present invention is applied to various kinds of magnetic garnet films each of which is epitaxially grown on the (111) oriented plane or a different plane of a monocrystalline nonmagnetic garnet substrate made of, for example, $Ga_3Gd_5O_{12}$.

As is evident from the foregoing explanation, according to the present invention, an ion-implanted layer in which the ion concentration distribution is uniform in the direction of depth, can be formed without reducing the inplane anisotropy field.

Further, hydrogen ions are the most favorable one of various kinds of ions which are implanted in a magnetic garnet film to form therein an ion-implanted layer.

As can been seen from the foregoing description, the present invention is very effective in fabricating an excellent CD device.

Further, when a magnetic bubble memory device is fabricated, the device is heated in a succeeding step such as a step for forming a detector (that is, a permalloy pattern). Accordingly, an annealing step may be included in the fabricating process at a time after an ion implantation according to the present invention has been carried out, or the annealing step is not included in the fabricating process and the device may be annealed by heat treatment in a succeeding step.

What is claimed is:

1. A method of implanting a magnetic garnet film with ions to provide an ion-implanted layer in a magnetic bubble memory device comprising the steps of:
   - providing a covering film on a magnetic garnet film for magnetic bubbles, said film comprising a material that scatters hydrogen ions and that prevents hydrogen ion evaporation;
   - implanting hydrogen ions in a desired portion of a surface region in said magnetic garnet film through said covering film to form said ion-implanted layer at said desired portion of said surface region, the direction of travel of said ions being irregularly changed as the ions pass through said covering layer, and
   - heating the ion-implanted layer to an annealing temperature to cause uniform distribution of the implanted ions in said ion-implanted layer of said garnet film under said covering layer.

2. A method according to claim 1, wherein said covering film is one selected from a group consisting of an insulating film, a semiconductor film and a conductor film.

3. A method according to claim 2, wherein said insulating film is formed of at least one selected from a group consisting of an $SiO_2$ film, a $TiO_2$ film, an SiO film, an $Al_2O_3$ film, an $Si_3N_4$ film, a $Cr_3O_4$ film and a phosphosilicate glass film.

4. A method according to claim 2 or 3, wherein the thickness of said insulating film substantially lies in a range from 500 to 6000 Å.

5. A method according to claim 2, wherein said semiconductor film and conductor film are selected from a group consisting of a polycrystalline silicon film, an amorphous silicon film, an Au film, an Mo film, a Cr film and an Au-Cu alloy film.

6. A method according to claim 2 or 5, wherein the thickness of said semiconductor film and conductor film substantially lies in a range from 500 to 3000 Å.

7. A method according to claim 1, wherein said implanting of hydrogen ions is performed with acceleration energy between 25 KeV and 400 KeV.

8. A method of making magnetic bubble memory devices comprising the steps of:

forming a covering film, capable of ion scattering and ion evaporation preventing, on a magnetic garnet film for magnetic bubbles;

implanting hydrogen ions in a desired portion of a surface region of said magnetic garnet film through said covering film to form an ion-implanted layer in said desired portion, the travelling direction of said implanted ions being irregularly changed during their passage through said covering film; and depositing thereafter, a pattern of a permalloy film on said garnet film, said permalloy film pattern depositing step including heating at least said garnet film having been partly ion-implanted.

9. A method according to claim 8, further comprising the step of annealing said ion-implanted garnet film to provide a uniform distribution of the concentration of said implanted ions in said garnet film with said covering film formed thereon.

10. A method according to claim 9, wherein said annealing step is simultaneously performed by said heating for said permalloy film pattern forming step.

11. A method according to claim 8, wherein said heating for said permalloy film pattern depositing step is effected at about 350° C.

12. A method according to claim 8, wherein said covering film is one selected from a group consisting of an insulating film, a semiconductor film and a conductor film.

13. A method according to claim 12, wherein said insulating film is formed of at least one selected from a group consisting of an $SiO_2$ film, a $TiO_2$ film, an SiO film, an $Al_2O_3$ film, an $Si_3N_4$ film, a $Cr_3O_4$ film and a phosphosilicate glass film.

14. A method according to claim 12 or 13, wherein the thickness of said insulating film substantially lies in a range from 500 to 6,000 Å.

15. A method according to claim 12, wherein said semiconductor film and conductor film are selected from a group consisting of a polycrystalline silicon film, an amorphous silicon film, an Au film, an Mo film, a Cr film and an Au-Cr alloy film.

16. A method according to claim 12 or 15, wherein the thickness of said semiconductor film and conductor film substantially lies in a range from 500 to 3,000 Å.

17. A method according to claim 8, wherein said implanting of hydrogen ions is performed with acceleration energy between 25 KeV and 400 KeV.

18. A method according to claim 1, wherein said ion-implanted layer is heated to an annealing temperature of 320° to 350° C.

* * * * *